United States Patent [19]

Lepik et al.

[11] 4,084,068
[45] Apr. 11, 1978

[54] SUPPORTING DEVICE FOR MOUNTING A MAGNETIC CORE ON A PRINTED CIRCUIT CARD

[75] Inventors: Toomas Lepik; Sven-Erik Rödin, both of Huddinge, Sweden

[73] Assignee: Telefonaktiebolaget L M Ericsson, Stockholm, Sweden

[21] Appl. No.: 723,592

[22] Filed: Sep. 15, 1976

[30] Foreign Application Priority Data

Oct. 2, 1975 Sweden .................................. 7511088

[51] Int. Cl.² .................... H01F 15/02; H01F 21/06
[52] U.S. Cl. ................... 174/138 R; 336/136
[58] Field of Search .......... 174/138 R, 138 D, 138 G; 336/65, 83, 136; 16/42 T; 242/118.61; 403/298, 365, 372; 361/403, 418, 419

[56] References Cited

U.S. PATENT DOCUMENTS

| 2,626,764 | 1/1953 | Dunlap | 242/118.61 |
| 2,644,978 | 7/1953 | Becker | 16/42 T |
| 3,743,853 | 7/1973 | Dittman et al. | 336/136 X |

FOREIGN PATENT DOCUMENTS 2,245,197  4/1974  Germany .............................. 336/136

*Primary Examiner*—Laramie E. Askin
*Attorney, Agent, or Firm*—Hane, Roberts, Spiecens & Cohen

[57] ABSTRACT

The invention relates to a supporting device for a magnetic core, a coil arranged on the core and an adjusting screw for changing the inductance of the coil. This complete unit is intended to be mounted on a printed circuit card with the supporting device being a holder for the adjusting screw and providing electrical insulation between the core and the printed circuit card. The supporting device is designed as a circular disc with an upright standing projecting part which is provided with an inner thread in which the adjusting screw can be inserted for adjusting the inductance of the coil. When mounting a unit consisting of a core, a coil, an adjusting screw and a supporting device, on a circuit card printed on both sides, the circular disc of the supporting device provides electrical insulation between the core and the printed circuit card.

2 Claims, 3 Drawing Figures

SUPPORTING DEVICE FOR MOUNTING A MAGNETIC CORE ON A PRINTED CIRCUIT CARD

The invention relates to a supporting device for mounting on a printed circuit card a magnetic core which has a centre hole and an adjusting screw for changing of the inductance of a coil arranged on the core.

When mounting inductors and transformers on printed circuit cards, such elements can be combined in units consisting of a magnetic core, a coil arranged about the core and an adjusting screw for fine adjustment of the inductance of the inductor or the transformer.

It is previously known to use a cylindric bushing having an inner thread which is pressed into the centre hole of a core. The bushing provides a support for the adjusting screw which by turning in the thread achieves the desired adjustment of the inductance. When mounting the core on the printed circuit card the core bears directly against the card. This way of mounting, however, cannot be carried out when the printed circuit card is provided with conductors on both sides and when there is a risk of electrical contact between the magnetic core and the conductors on the printed circuit card.

An object of the present invention is to solve the problem of mounting the magnetic core on such circuit cards which on both sides are provided with printed circuitry.

The invention is characterized as appears from the appended claims.

The invention is described more in detail below by means of an embodiment with reference to the accompanying drawing on which FIG. 1 shows a supporting device according to the invention in side view and partially in section looking in the direction of the line 1—1 in FIG. 2;

Figure 1:
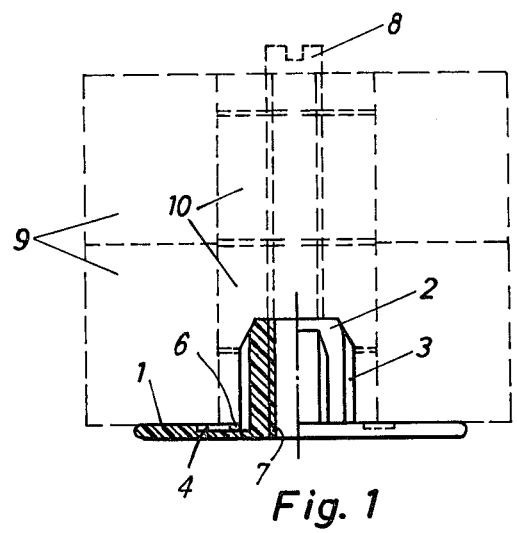
Figure 2:
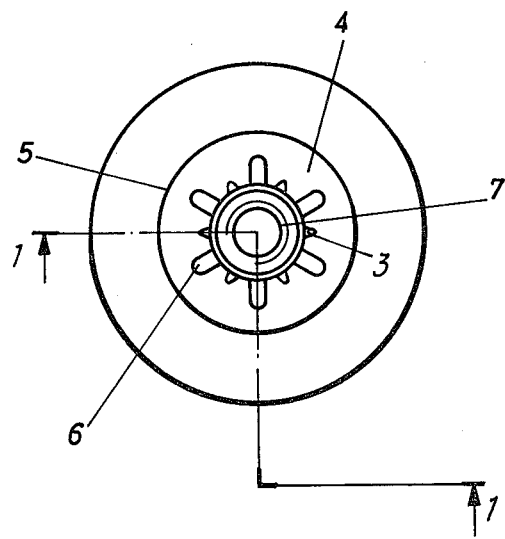
FIG. 2 shows a supporting device according to the invention in plan view.
Figure 3:
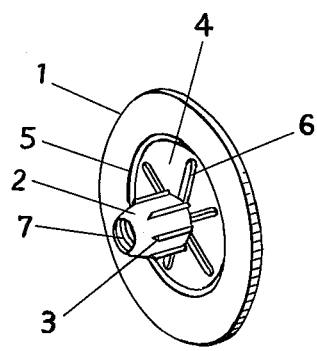
FIG. 3 is a perspective view of the supporting device.

According to FIGS. 1 and 3 the supporting device has a circular disc designed part 1 which in the centre is provided with an upright standing projecting part 2. The projecting part is provided with longitudinal ridges 3 which at their upper ends have an inclined surface in the direction towards the centre of the projecting part. As appears from FIGS. 2 and 3 the circular disc 1 is provided with a groove 4 which on the one hand is limited by a circle 5 and on the other hand by shoulders 6 directed radially from the projecting part. The upper surface of the shoulders lies in the same plane as the surface of the circular disc outside the circle 5. The supporting device is provided with a screw thread 7 for an adjusting screw 8 indicated with dashed lines in FIG. 1. On the drawing a magnetic core 9 is also indicated with a dashed line and a coil 10 arranged on the core.

When assemblying the supporting device and the magnetic core, the projecting part 2 is pressed into the centre hole of the magnetic core whereby the ridges 3 owing to their inclined surface penetrate into the hole of the magnetic core and by their deformation achieve a fixed engagement between the supporting device and the magnetic core. In order to achieve a tighter connection between the supporting device and the core, the surface of the circular disc 1 which is directed towards the core can be provided with an adhesive means. The purpose of the groove 4 is to leave space for possible chips produced when pressing the ridges 3 into the centre hole of the magnetic core. The purpose of the shoulders 6 which limit the groove is to give a contact surface when pressing the supporting device into the magnetic core. Otherwise there is a risk that the circular disc 1 will be deformed when assemblying the supporting device and the core.

The mounted supporting device provides, besides a holding for the adjusting screw, also an insulating surface for bearing against the circuit card and makes possible the mounting of the magnetic core on a circuit card which has printed circuitry on both its sides.

We claim:

1. Supporting device for mounting on a printed circuit card a magnetic core which has a center hole and an adjusting screw for changing the inductance of a coil arranged on the magnetic core, said supporting device comprising a plate of insulating material, a projecting part extending perpendicular from said plate, said projecting part having a threaded passageway for receiving the adjusting screw, said projecting part on its outer surface being provided with longitudinal ridges so that when inserting said projecting part into the center hole of the magnetic core, the sharp edges of the magnetic core will bite into said ridges so as to form a tight engagement between the projecting part and the magnetic core, and the surface of said plate from which said projecting part extends having an annular recess for providing a receptacle for chips which are produced when the sharp edges of the magnetic core cut into said longitudinal ridges during the pressing of said projecting part into the center hole of the magnetic core.

2. The supporting device according to claim 1 further comprising shoulders situated in the annular recess of said plate and directed radially outward from the projecting part on the same level as the upper surface of the said plate whereby the shoulders will constitute a contact surface between said plate and the magnetic core so that said plate is not deformed when pressing the projecting part into the center hole of the magnetic core.

* * * * *